United States Patent [19]

Bradley

[11] Patent Number: 5,022,042
[45] Date of Patent: Jun. 4, 1991

[54] HIGH POWER LASER ARRAY WITH STABLE WAVELENGTH

[75] Inventor: Eric M. Bradley, San Diego, Calif.

[73] Assignee: General Dynamics Corp., San Diego, Calif.

[21] Appl. No.: 580,100

[22] Filed: Sep. 10, 1990

[51] Int. Cl.$^5$ .......................... H01S 3/08; H01S 3/094
[52] U.S. Cl. ........................................ 372/75; 372/29; 372/32; 372/50; 372/96
[58] Field of Search ..................... 372/75, 29, 32, 50, 372/92, 96, 18

[56] References Cited

U.S. PATENT DOCUMENTS

| | | | |
|---|---|---|---|
| 4,803,692 | 2/1989 | Sakano et al. | 372/50 |
| 4,870,651 | 9/1989 | Taneya et al. | 372/50 |
| 4,914,667 | 4/1990 | Blouder et al. | 372/44 |

*Primary Examiner*—James W. Davie
*Attorney, Agent, or Firm*—Brown, Martin, Haller & McClain

[57] ABSTRACT

A semiconductor diode laser is aligned to a waveguide with two sections, a first section being a passive low-loss waveguide and a second section being a Bragg grating. The first section works to increase the total cavity length l of the laser by about 1 to 2 cm. The lengthening of the cavity reduces the longitudinal mode spacing $\Delta\lambda$ according to the equation $\Delta\lambda = \lambda^2/2nl$, and provides a higher average output power level because it is substantially immune to mode hop-induced fluctuations. The second section causes the output to be centered at the desired wavelength depending on the grating spacing. An array of diode lasers with an array of waveguides as described above provides a high power source with a controlled bandwidth. The high power laser array with stabilized output wavelength is used to pump a solid state laser crystal.

18 Claims, 2 Drawing Sheets

HIGH POWER LASER ARRAY WITH STABLE WAVELENGTH

FIELD OF THE INVENTION

The present invention is related to semiconductor diode lasers and more specifically to diode lasers for solid state laser pumping.

BACKGROUND OF THE INVENTION

Light sources for free space optical communications require a substantial amount of power in order to overcome atmospherically-induced noise and the laser beam's inherent diffraction. This power requirement is greater than can be achieved with a single diode laser, although in all other aspects, diode lasers are the preferred choice as light sources because of their reliability and emission wavelength range.

One solution to achieve higher powers has been to use a pumped Nd:YAG laser. Such lasers emit continuous wave power and pulse energies which are well in excess of what is required for most communication applications, and, their wavelength (1.064 $\mu$m) falls within a range where high-quantum-efficiency detectors are available.

Historically, the main problems with Nd:YAG lasers for optical communications were the low reliabilities and low efficiencies of their lamp pumps. Semiconductor diode lasers have been found to be good pump sources, especially since they can be fabricated to emit at 0.81 $\mu$m, the most efficient pumping band for Nd:YAG lasers.

For the purposes of pumping, it is critical that the center frequency of the source be held constant. This differs from the requirements of optical communication and high data rate fiber transmission, where line width, rather than center frequency, is of extreme importance, with the required line width commonly being on the order of 0.00001 Å to 1 Å. Diode pumping is not as sensitive to line width, with an absorption band being on the order of 5 Å wide, however, constant power levels are essential, and the greater the pumping power the better.

In order to achieve higher output power levels for Nd:YAG lasers, several diode lasers have been combined in arrays. These power levels are still somewhat deficient and efforts are being made toward increasing the power levels available from diode pumped Nd:YAG lasers. More pumping power is available by increasing the current, however, diode lasers are highly sensitive to wavelength shifts with temperatures. Due to the large amounts of drive current delivered to a diode pump during a single pulse, the diode heats up so quickly that the emission wavelength drifts from one extreme of the Nd:YAG laser's absorption band to the other in a matter of microseconds. Changes of this rapidity cannot be controlled by thermo-electric cooling techniques with feedback loops.

It would be desirable to provide a diode laser or an array of diode lasers which can deliver a high level of pumping power to a Nd:YAG or other solid state laser with greatly reduced sensitivity to temperature-induced wavelength shifts in the center frequency. It is to this object the present invention is directed.

BRIEF SUMMARY OF THE INVENTION

It is an advantage of the present invention to provide a diode laser and an array of such diode lasers which are temperature stabilized to assure stability of the emission center frequency for the purpose of pumping a solid state laser.

In an exemplary embodiment, a semiconductor diode laser is aligned to a waveguide with two sections, a first section being a passive low-loss waveguide and a second section being a Bragg grating. The first section works to increase the total cavity length of the laser by about 1 to 2 cm. The lengthening of the cavity reduces the longitudinal mode spacing $\Delta\lambda$ according to the equation $\Delta\lambda = \lambda^2/2nl$, where n is the waveguide index of refraction, so that $\Delta\lambda$ is 0.1 Å when cavity length l is 1.5 cm for $\lambda = 0.8$ $\mu$m. The resulting mode spectrum contains 10 longitudinal modes within a 1 Å band. The combining of several longitudinal modes from a single laser within a tight range of the optimum center frequency of the laser to be pumped prevents mode hops from altering the total average power emitted by the diode laser.

The second section causes the output to remain centered at the desired wavelength depending on the spacing between the ridges of the Bragg grating.

The present invention also provides a higher average output power level because it is substantially immune to mode hop-induced fluctuations. The output power of a diode laser with an external Bragg reflector, when its resonance mode is drifting through the reflection peak of the Bragg grating, varies with temperature as a sawtooth wave. By making the Bragg reflection peak narrower, the extent of the deviation of the sawtooth pattern can be restricted. A mode hop still occurs with the present invention, but the mode hop is restricted to occur within the central peak of the Bragg grating's reflection spectrum. By making the spacing between the longitudinal modes relatively narrow, the size of any given mode hop becomes much smaller than with a single longitudinal mode, thus reducing any variations in output power level that result from mode hops.

An array of diode lasers with an array of waveguides as described above provides a high power source with a controlled bandwidth. The lasers may be monolithically fabricated and spaced closely enough to cause them to couple coherently, or they may be spaced more widely so that they lase independently of each other. In either case, the gratings will be fabricated at spacings to match those of the lasing stripes.

The high power laser array with stabilized output wavelength is used to pump a solid state laser crystal, such as Nd:YAG, illuminating the crystal with the output light from the array. A lens may be included between the laser array and the laser crystal.

BRIEF DESCRIPTION OF THE DRAWINGS

Understanding of the present invention will be facilitated by consideration of the following detailed description of the preferred embodiment of the present invention, taken in conjunction with the accompanying drawings, in which reference numerals refer to like parts and in which.

DETAILED DESCRIPTION OF THE PREFERRED EMBODIMENT

Figure 1:
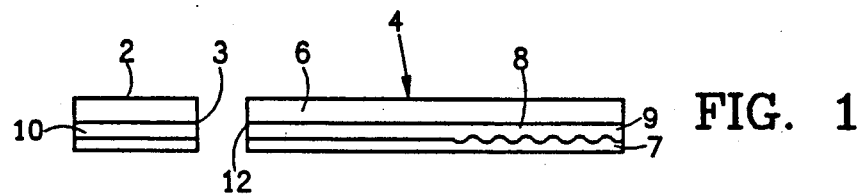
FIG. 1 is a side elevation of a diode laser and a waveguide according to the present invention.

As shown in FIG. a laser 2 is aligned with a waveguide 4 which consists of a passive waveguide section 6 and a Bragg grating section 8.

Laser 2 is a conventional diode laser which is commercially available. The laser active layer 10 is aligned with the waveguide 4 for efficient coupling of the light into the waveguide then back into the laser. Waveguide 4 comprises two sections. The passive waveguide section 6 is located adjacent to the rear facet of laser 2 with an anti-reflection coating affixed at the interface 12 between the waveguide and the laser 2.

In order to space the longitudinal modes closely enough to have ten modes within a 1 Å band, the total cavity length of the laser (i.e., laser plus grating plus passive waveguide section) is increased by the passive waveguide section 6. The length l of low-loss section 6 is determined according to the equation $\Delta\lambda = \lambda^2/2nl$ where $\Delta\lambda$ is the mode spacing, $\lambda$ is the center wavelength, and n is the waveguide refractive index. For a mode spacing of 0.1 Å and $\lambda=0.8$ μm (a typical emission wavelength for GaAs lasers), the total cavity length is about 1.5 cm. For an InGaAsP laser emitting at 1.3 μm, the cavity length should be 4 cm to achieve a mode spacing of 0.1 Å.

Figure 2A:
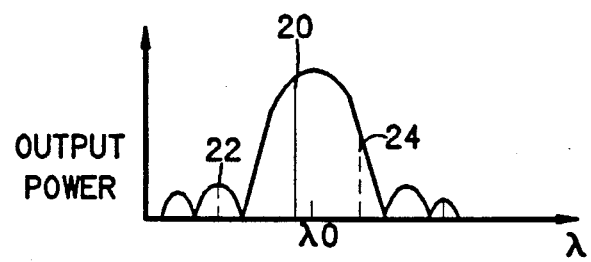
FIGS. 2a, 2b and 2c are a series of plots of output power versus wavelength showing the sequential change with temperature of the performance of a prior art laser.
Figure 2B:
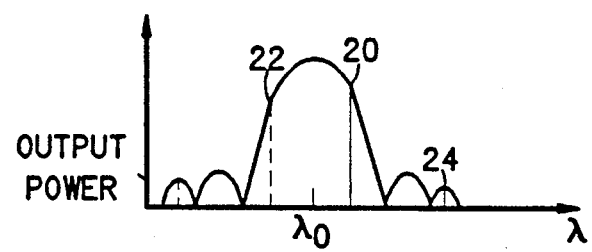
Figure 2C:
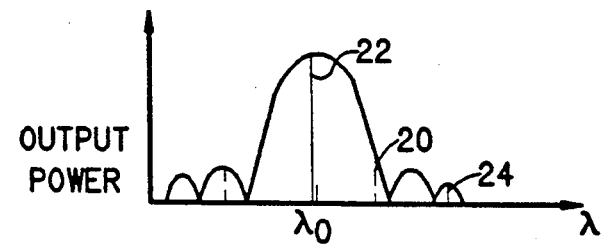

FIGS. 2a, 2b and 2c show plots of oscillatory wavelength versus output power at three different temperatures for a prior art diode laser with DBR (distributed Bragg reflector) grating. FIG. 2a illustrates an initial condition where the dominant mode 20 is located near center frequency $\lambda_0$. Subordinate modes 22 and 24 are shown with a mode spacing approximately one-half the bandwidth of the DBR reflection peak, such that only one mode can exist within the wavelength range at or near maximum power. If the temperature increases, mode 20 drifts to the right, remaining dominant but with mode 22 gaining strength, resulting in a change in overall output power due to the combination of mode 20 and 22. In FIG. 2c with further temperature increase, a mode hop occurs with mode 22 becoming dominant and another change in output power from the conditions shown in FIG. 2b. Thus, with time, power changes suddenly when a mode hop occurs, resulting in an unpredictable pattern of output power versus temperature (or time).

Figure 3A:
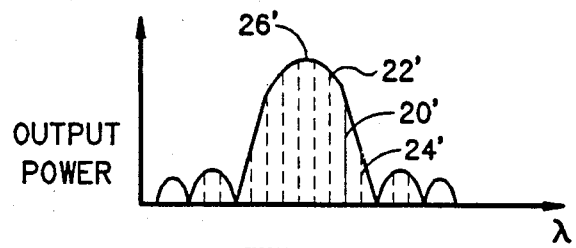
FIGS. 3a and 3b are a series of plots of output power versus wavelength showing performance of a laser according to the present invention.
Figure 3B:
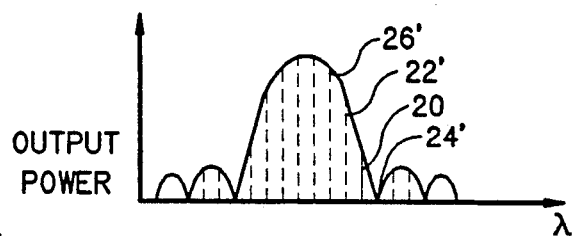

FIGS. 3a and 3b show plots of oscillatory wavelength versus output power for a laser according to the present invention with narrow mode spacing. The range of wavelength is restricted so even though mode hops still occur with increased temperature, the size of the mode hop is much smaller so the degree of power fluctuation is greatly reduced. Within the narrow bandwidth at t=0 in FIG. 3a modes 20', 22' and 26' all exist at a relatively high power. At a later time, shown in FIG. 3b, a mode hop has occurred with mode 22' becoming dominant, but there are so many modes near the peak that the situation is not noticeably changed and the output does not change significantly.

It is also known that the airspace between the laser and the waveguide creates a Fabry-Perot resonance effect which results in power fluctuations as a function of gap distance, emission wavelength and drive current. The large number of closely spaced longitudinal modes reduces this effect, but it is still preferred that waveguide 4 be placed as close as possible to the laser's output facet 3, with gap being less than 0.1 μm.

The waveguide 4 comprises dielectric layers of different refractive indices. The first dielectric layer 7 is $SiO_2$, which has a change in refractive index with temperature (hereinafter called "index-temperature coefficient") of approximately $1.0 \times 10^{-5}/°C$. In the Bragg grating section 8 of waveguide 4 a periodic structure is formed at the top of optical waveguide layer 7. In the passive waveguide section 6, there is no periodic structure and the waveguide remains smooth. The periodic structure in section 8 has a period of spacing $\Lambda$ and is corrugated with notches or ribs running perpendicular to the light path. The notches are equidistant at spacing $\Lambda$ in order to satisfy the equation $\lambda_{peak}=2\Lambda n_{eff}$ for the center wavelength of the desired bandwidth.

The second dielectric layer 9 comprises a material which has an index-temperature coefficient which is approximately equal in magnitude but opposite to the index-temperature coefficient of $SiO_2$. Since the waveguiding is dependent upon the refractive index of the two layers within the waveguide, the preferred embodiment seeks to maintain the refractive index at a constant level, by cancelling the changes in the refractive index of one layer with the changes in refractive index of the other layer. The suggested material for the second dielectric layer 9 is $Ta_2O_5$, however, other materials possessing the same index-temperature coefficient of approximately $-1.2$ to $-1.4 \times 10^{-5}/°C$. are acceptable.

Figure 4:
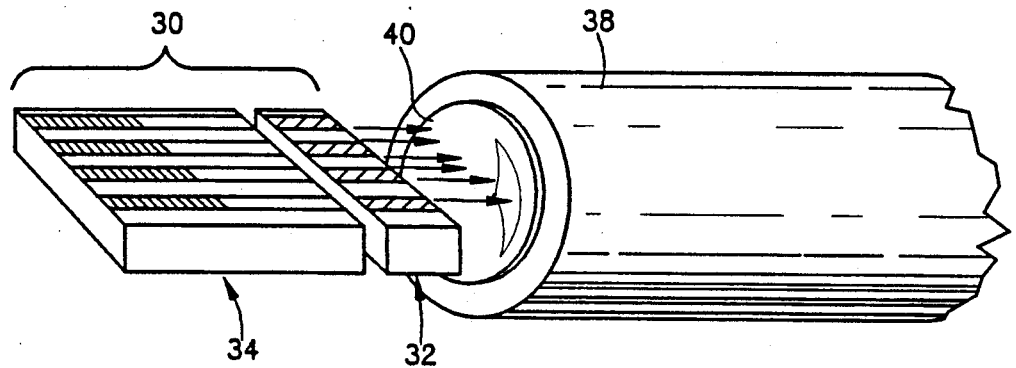
FIG. 4 is a diagrammatic view of a high power laser array and a solid state laser crystal.

The high power array 30 of lasers shown in FIG. 4 consists of a linear array 32 of lasers combined with a linear array 34 of waveguides as described above. The linear array 32 of lasers is preferably monolithically fabricated, as is the linear array 34 of waveguides. The lasers within area 32 may be spaced closely enough to cause them to couple coherently, or they may be spaced more widely so that they lase independently of one another. The array 34 of waveguides must be spaced to match the lasing stripes 36 of array 32.

The high power laser array is used to pump a solid state laser crystal 38 such as, but not limited to, Nd:YAG, illuminating and exciting the crystal 38 with output light from the array 30. A lens 40 may be included between the array 30 and the crystal 38 to focus the light, assuring that the maximum amount of light is captured for use in pumping. FIG. 4 illustrates an end pumping configuration which is preferred because a pump light is more efficiently coupled into the laser mode. However, a side pump configuration may also be used.

It will be evident that there are additional embodiments which are not illustrated above but which are clearly within the scope and spirit of the present invention. The above description and drawings are therefore intended to be exemplary only and the scope of the invention is to be limited solely by the appended claims.

I claim:

1. A temperature stabilized diode laser assembly for providing high power output comprising:

a diode laser for emitting a plurality of longitudinal modes within a band of wavelengths, said plurality of longitudinal modes having a spacing; and a waveguide adjacent to said diode laser, said waveguide comprising a first section and a second section, said first section having a length determined to create a lengthened cavity for said diode laser to decrease said spacing between said plurality of longitudinal modes and a second section having a Bragg grating disposed therein so that output of said laser assembly is a plurality of narrowly spaced longitudinal modes centered at a desired center frequency.

2. A laser assembly as in claim 1 wherein said waveguide comprises a plurality of dielectric layers.

3. A laser assembly as in claim 2 wherein said plurality of dielectric layers comprises a first dielectric layer having a first index-temperature coefficient and a second dielectric layer having a second index-temperature coefficient which is approximately equal to and opposite said first index-temperature coefficient.

4. A laser assembly as in claim 1 wherein said Bragg grating comprises a plurality of corrugated ridges with a spacing between said plurality of ridges determined according to said desired center frequency.

5. A laser assembly as in claim 1 wherein said length is determined by said band of wavelengths emitted by said diode laser.

6. A laser assembly as in claim 1 wherein a spacing between said diode laser and said waveguide is on the order of 0.1 $\mu$m or less.

7. A laser assembly as in claim 1 wherein an antireflective coating is disposed between said diode laser and said waveguide.

8. An array of temperature stabilized diode lasers for pumping a solid state laser comprising:
   an array of diode lasers for emitting a plurality of longitudinal modes within a selected band of wavelengths, said plurality of longitudinal modes having a spacing; and
   an array of waveguides adjacent to said array of diode lasers, one waveguide of said array aligned with each diode laser, each waveguide comprising a first section and a second section, said first section having a length determined to create a lengthened cavity for said diode laser to decrease said spacing of said plurality of longitudinal modes and a second section having a Bragg grating disposed therein so that an output of said laser assembly is a plurality of narrowly spaced longitudinal modes centered at a desired center frequency.

9. An array as in claim 8 wherein said array of diode lasers is spaced to cause each laser of said array to couple coherently with all other lasers of said array.

10. A method of forming a temperature stabilized diode laser assembly for providing high power output comprising:
    selecting a diode laser for emitting a plurality of longitudinal modes within a band of wavelengths, said plurality of longitudinal modes having a spacing;
    forming a waveguide having two sections, a first section having a length selected to lengthen an effective cavity of said diode laser to decrease said spacing between said plurality of longitudinal modes and a second section having a Bragg grating; and
    assembling said diode laser adjacent to said first section of said waveguide.

11. A method as in claim 10 wherein the step of forming a waveguide further comprises depositing a plurality of dielectric layers wherein a first dielectric layer has a first index-temperature coefficient and a second dielectric layer has a second index-temperature coefficient equal and opposite said first index-temperature coefficient.

12. A method as in claim 10 wherein the step of forming a waveguide includes selecting said length depending on said band of wavelengths emitted by said diode laser.

13. A method as in claim 10 wherein the step of forming said waveguide further comprises selecting a grating spacing for said Bragg grating to correspond to a desired center frequency.

14. A method of pumping a solid state laser crystal comprising:
    selecting an array of diode lasers for emitting light within an absorption band of said solid state laser, said light having a plurality of longitudinal modes with a spacing;
    forming an array of waveguides with a spacing between each waveguide to match a spacing of said array of diode lasers, each waveguide having two sections, a first section having a length selected to lengthen an effective cavity of a corresponding diode laser to cause a decrease in spacing of said plurality of longitudinal modes emitted by said corresponding diode laser, and a second section having a Bragg grating;
    assembling said array of diode lasers adjacent to said array of waveguides at said first section;
    locating said solid state crystal in an emission path of said array of diode lasers; and
    activating said array of diode lasers to emit light into said solid state laser crystal to excite said crystal.

15. A method of pumping as in claim 14 wherein the step of forming said waveguide further comprises selecting a grating spacing for said Bragg grating to correspond to a desired center frequency.

16. A method of pumping as in claim 14 further comprising locating a focusing lens in said emission path between said array of lasers and said crystal.

17. A method of pumping as in claim 14 wherein the step of forming said array of waveguides includes selecting said length to cause at least ten longitudinal modes to exist within a said absorption band.

18. A method of pumping as in claim 14 wherein the step of forming said array of waveguides includes selecting a grating spacing for said Bragg grating to correspond to a center frequency of said absorption band.

* * * * *